(12) United States Patent
Savage et al.

(10) Patent No.: US 6,897,673 B2
(45) Date of Patent: May 24, 2005

(54) METHOD AND INTEGRATED CIRCUIT FOR CAPACITOR MEASUREMENT WITH DIGITAL READOUT

(75) Inventors: Scott Christopher Savage, Fort Collins, CO (US); John Lynn McNitt, Fort Collins, CO (US); Sean Anthony Golliher, Windsor, CO (US)

(73) Assignee: LSI Logic Corporation, Milpitas, CA (US)

( * ) Notice: Subject to any disclaimer, the term of this patent is extended or adjusted under 35 U.S.C. 154(b) by 35 days.

(21) Appl. No.: 10/392,206

(22) Filed: Mar. 19, 2003

(65) Prior Publication Data

US 2004/0183560 A1 Sep. 23, 2004

(51) Int. Cl.[7] .......................... G01R 31/02; G01R 31/26
(52) U.S. Cl. ........................................ 324/765; 324/763
(58) Field of Search ................................ 324/763, 765, 324/158.1; 341/120, 172

(56) References Cited

U.S. PATENT DOCUMENTS 6,268,813 B1 * 7/2001 de Wit ........................ 341/120

* cited by examiner

Primary Examiner—Vinh Nguyen
Assistant Examiner—Russell M. Kobert
(74) Attorney, Agent, or Firm—Yee & Associates, P.C.

(57) ABSTRACT

On-chip absolute value measurement circuit and an on-chip capacitor mismatch value measurement circuits are provided. The absolute value measurement circuit begins charging a capacitor. When the voltage across the capacitor reaches a first threshold, the absolute value measurement circuit starts a counter. When the voltage across the capacitor reaches a second threshold, the counter stops. The counter value is provided as digital output. A computer device reads the digital output and calculates the absolute value of the capacitor based on the counter value. The mismatch measurement circuit repeatedly charges an evaluation capacitor and transfers the charge from the evaluation capacitor to an integrating capacitor. For each transfer of charge, a counter is incremented until the voltage across the integrating capacitor reaches a threshold voltage. The counter value is provided as digital output. This process is repeated for each evaluation capacitor on the chip. A computer device reads each counter value and calculates mismatch values based on the counter values.

10 Claims, 8 Drawing Sheets

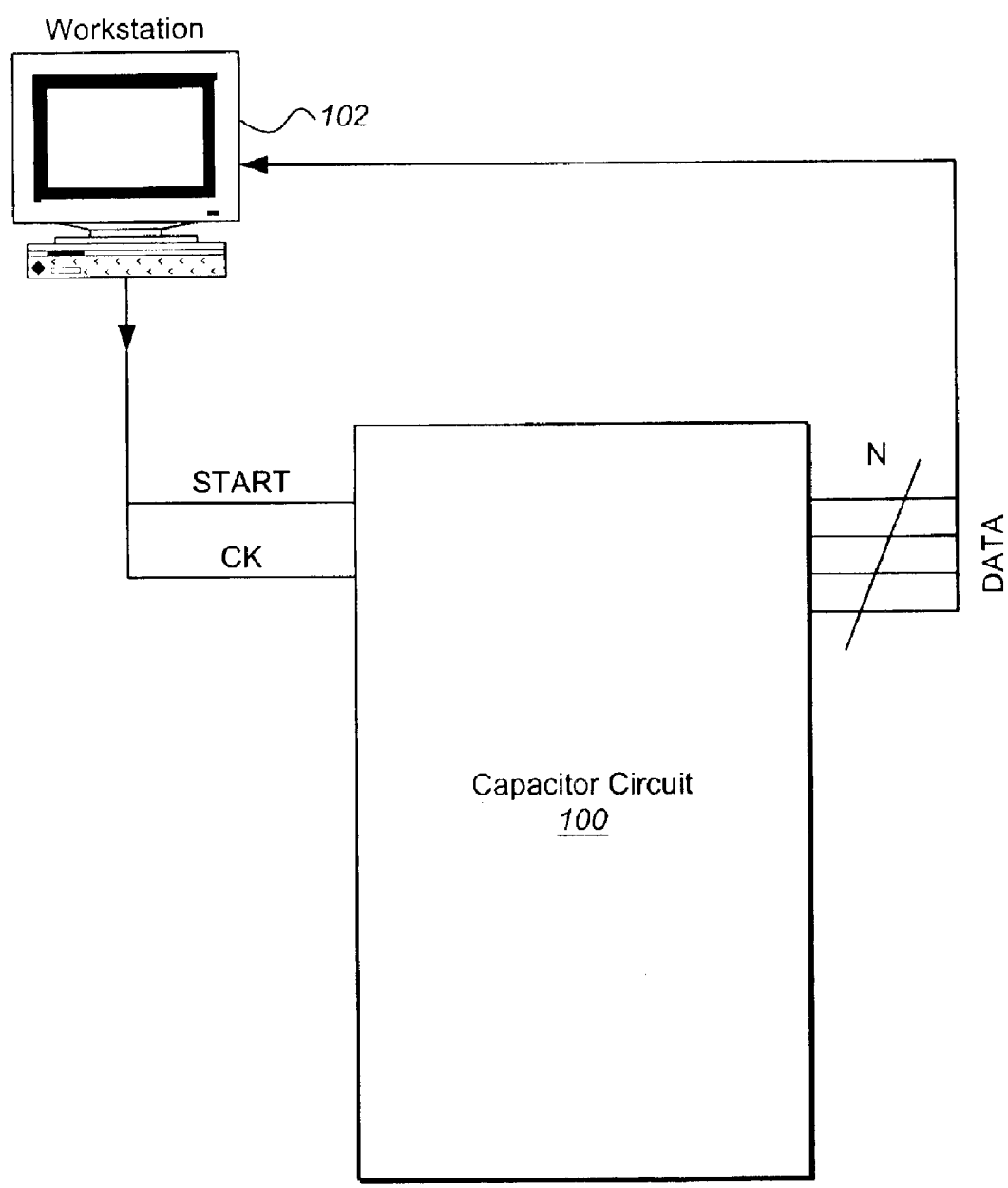
FIG._1

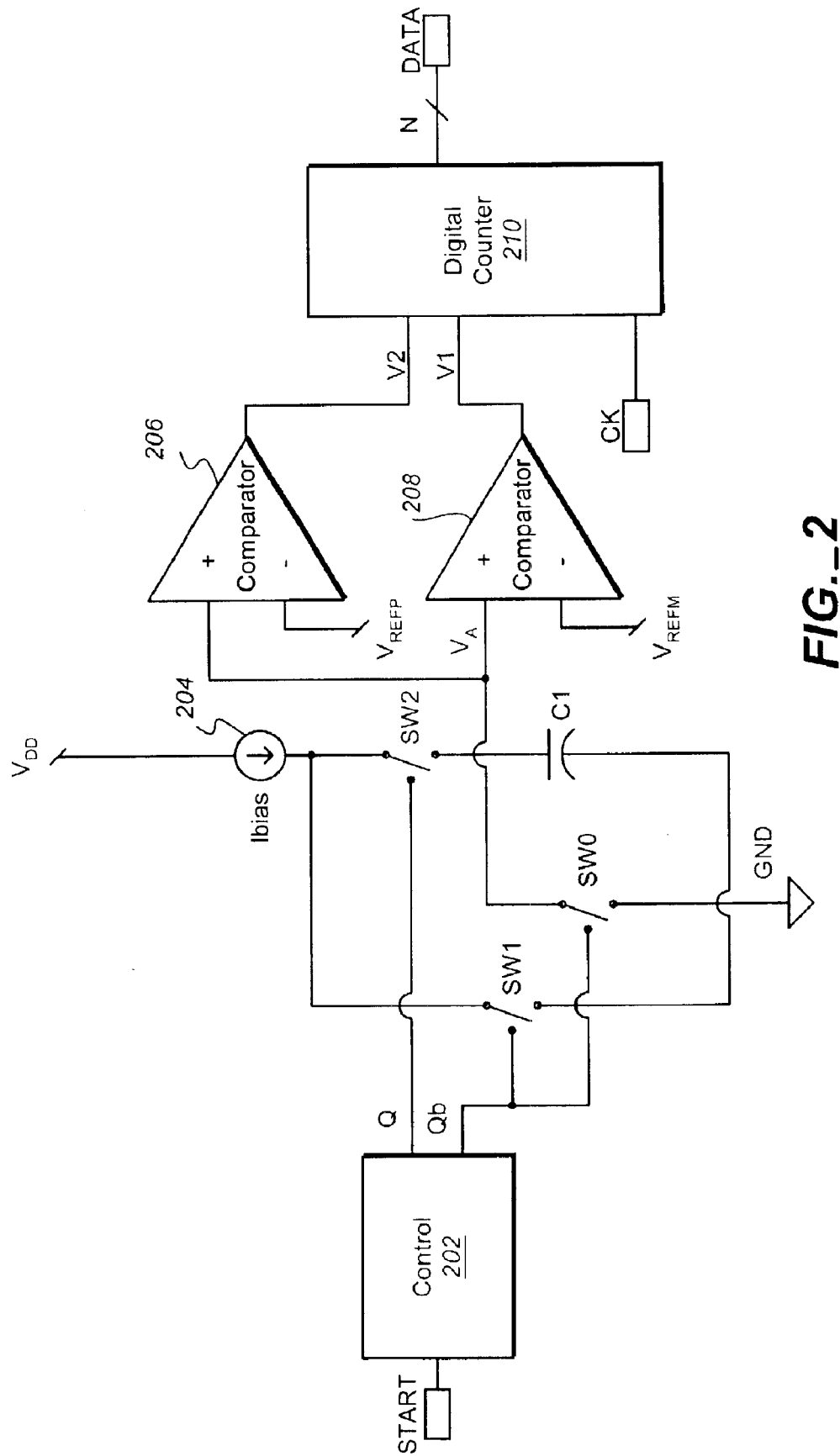
FIG._2

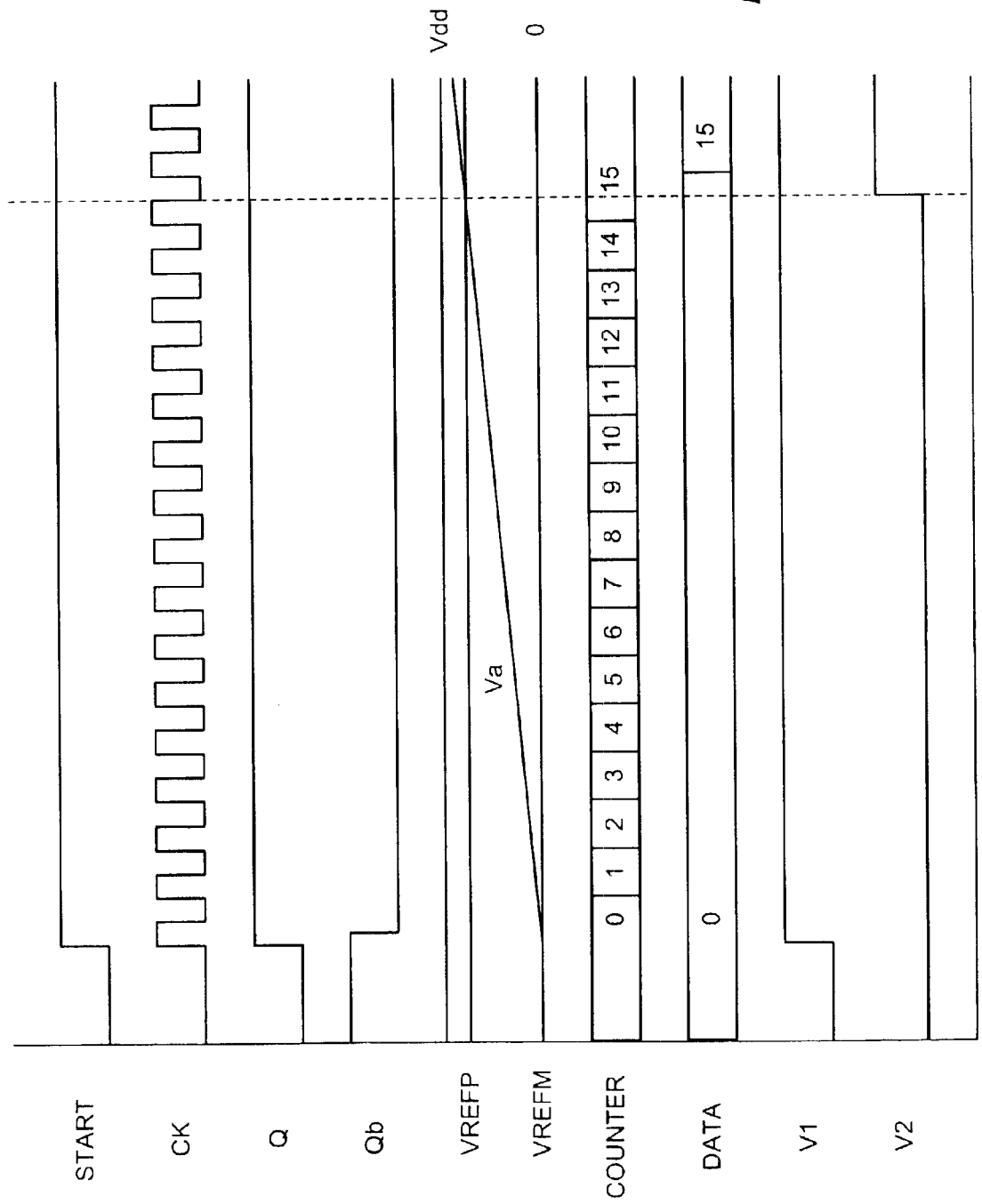
FIG._3

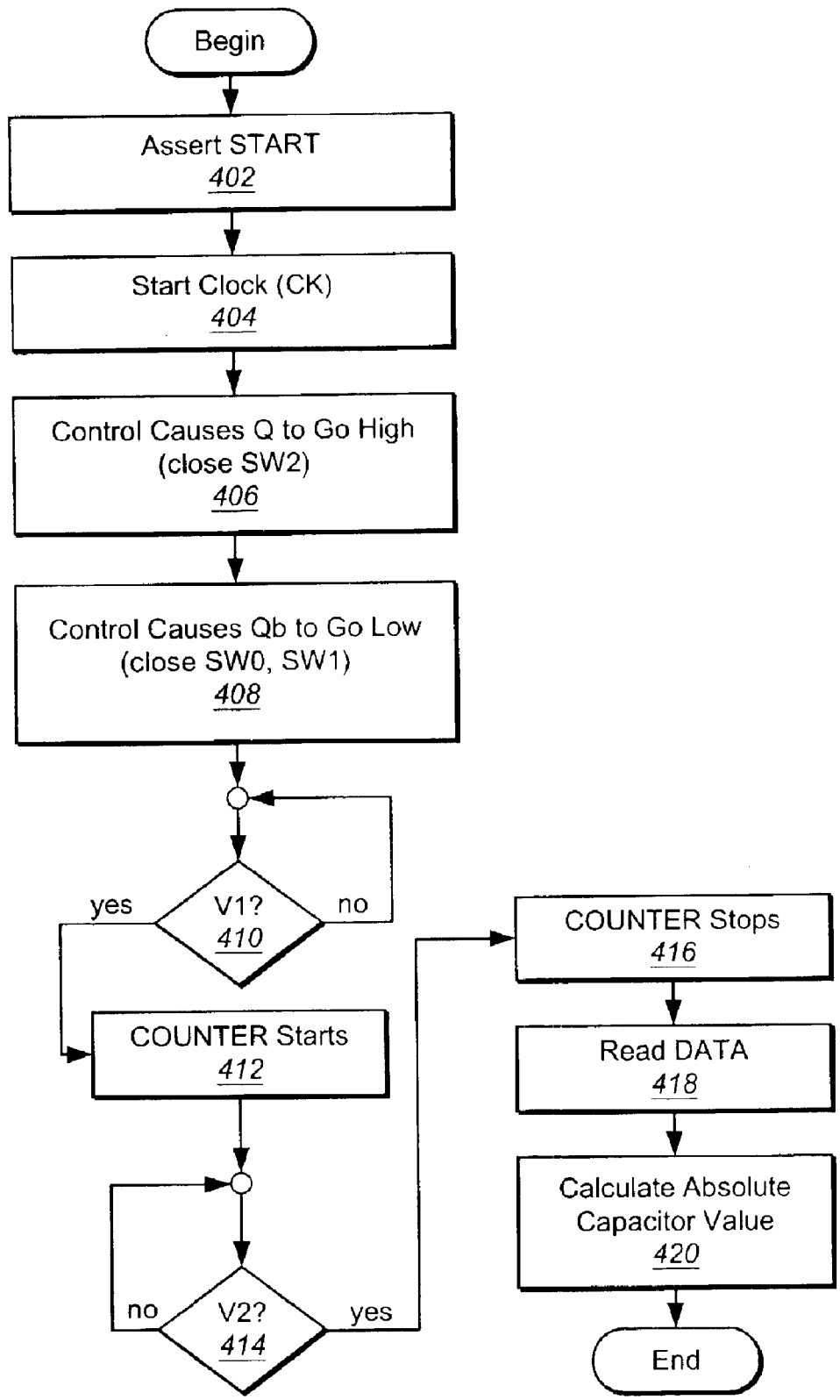
FIG._4

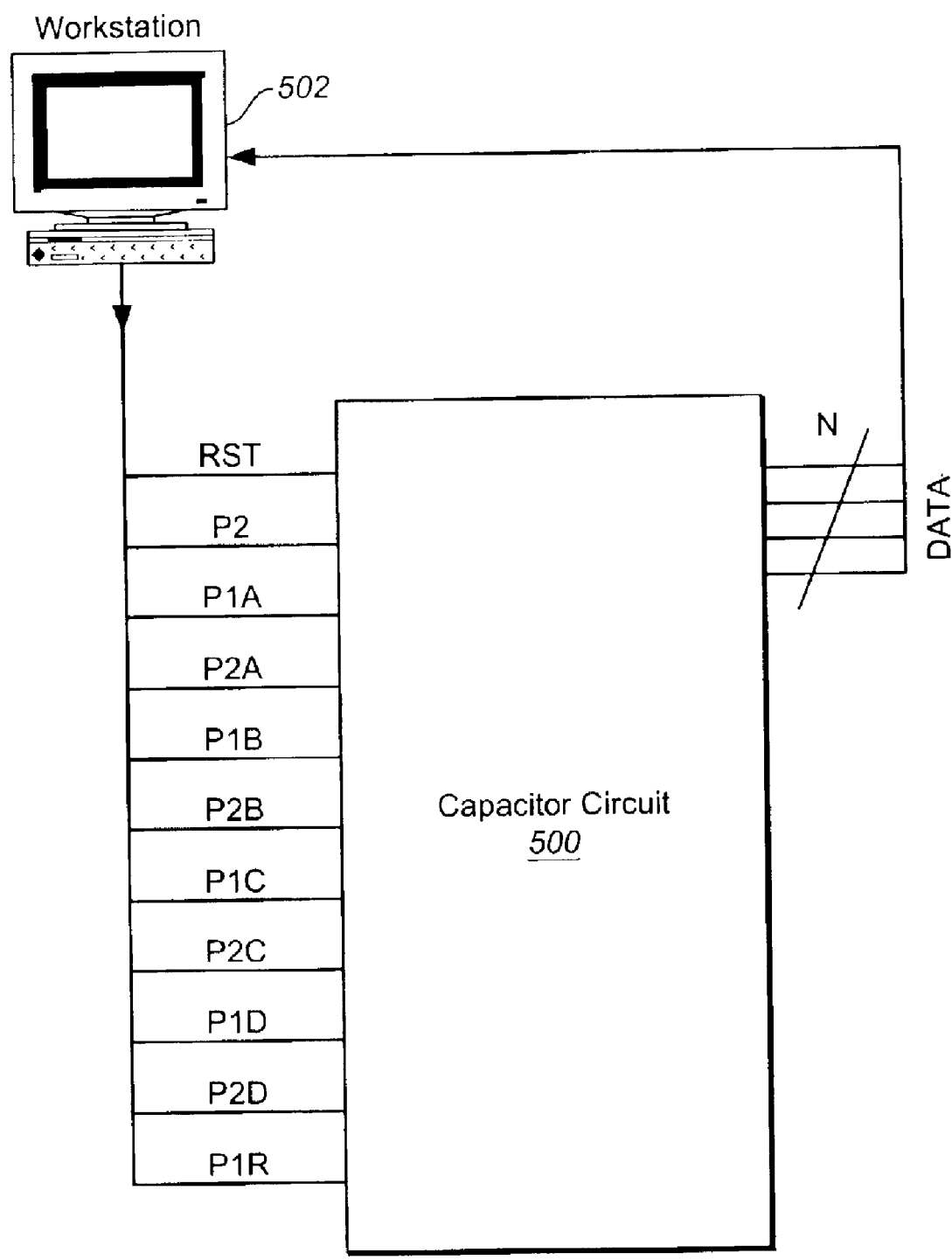
FIG._5

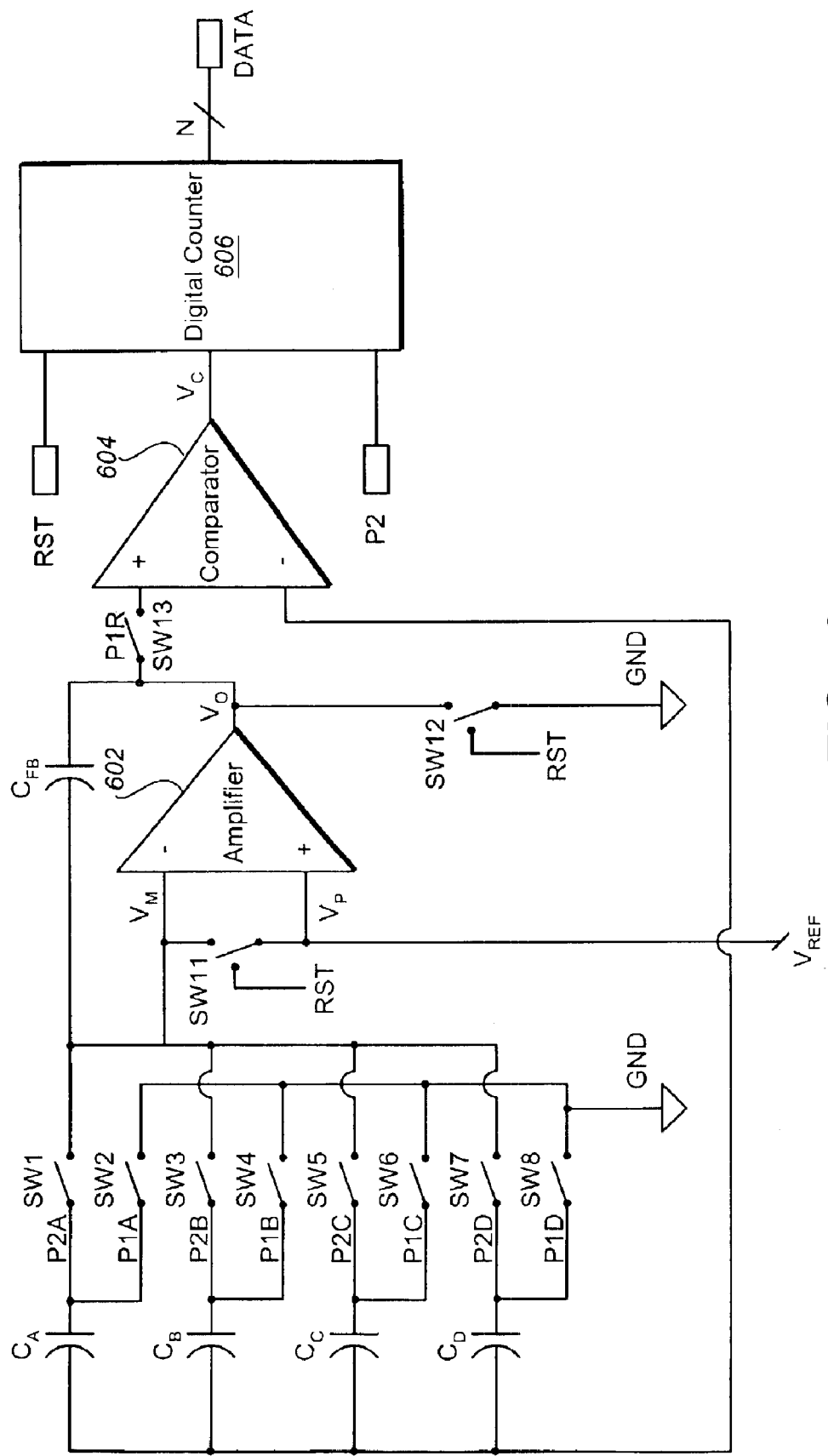
FIG._6

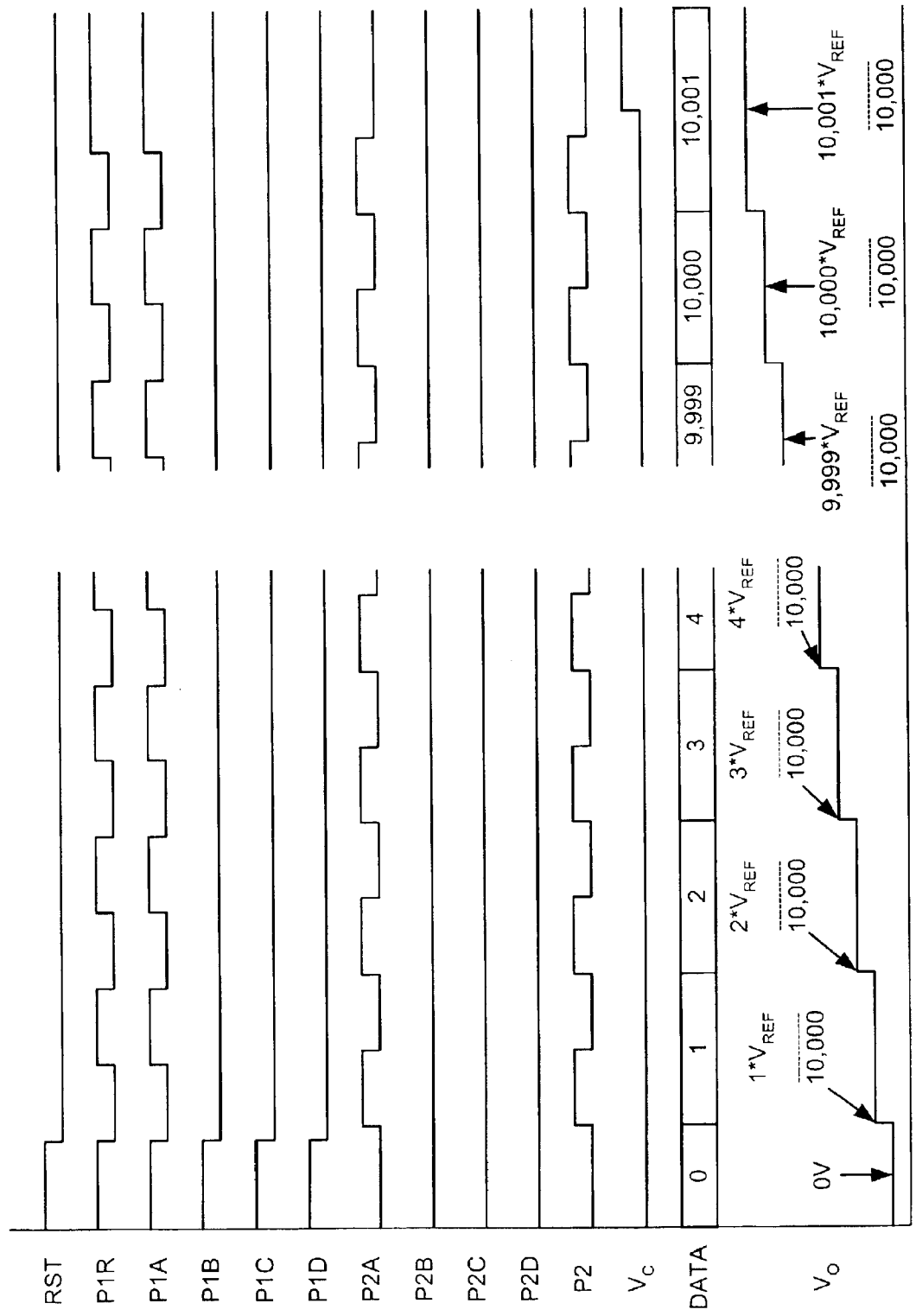
FIG._7

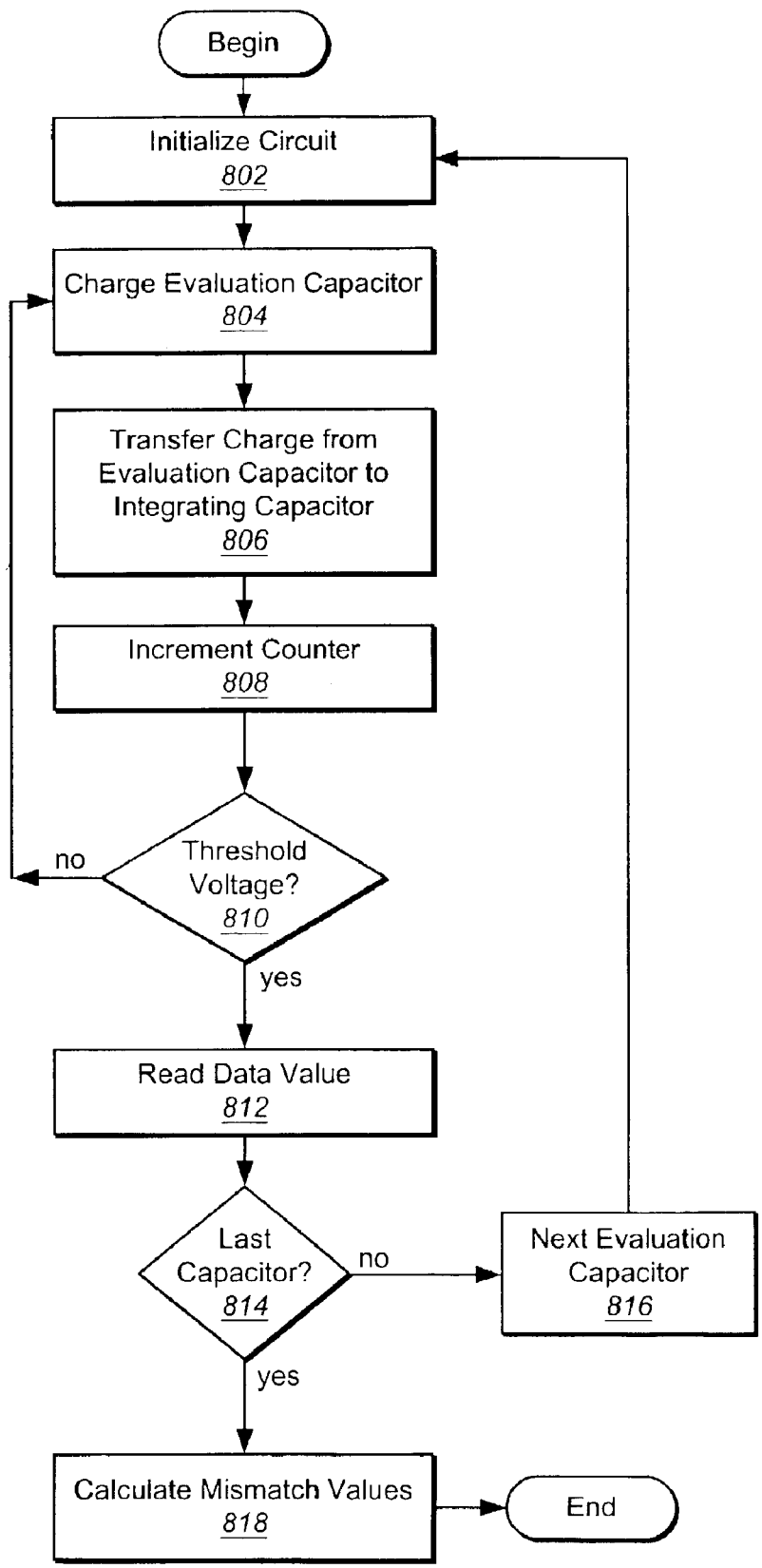
FIG._8

METHOD AND INTEGRATED CIRCUIT FOR CAPACITOR MEASUREMENT WITH DIGITAL READOUT

BACKGROUND OF THE INVENTION

1. Technical Field

The present invention relates to capacitor mismatch and absolute value measurements and, in particular, to analog built-in self test circuits. Still more particularly, the present invention provides a method and integrated circuit for on-chip capacitor measurement with digital readout.

2. Description of the Related Art

It is advantageous to know accurate capacitor absolute values and capacitor mismatch values of on-chip capacitors. Many analog circuits rely on precise values or ratios of capacitors for proper operation. For example, an analog-to-digital converter (ADC) relies upon capacitor mismatch for correct operation.

Generally, capacitor absolute values and capacitor mismatch values are measured with capacitor/voltage (CV) test equipment. This manual approach is lacking, because a specialized and expensive test setup is needed to place probes on a chip to extract the density of on-chip capacitor structures. This procedure requires that the test structures be accessible by a probe station. Furthermore, capacitor value measurements are so specific and specialized that, in general, no other tests can be performed with this same setup, since the setup is specialized for capacitor value measurements only.

As the size of the unit capacitor gets smaller, the accuracy of the absolute measurement is degraded. When the size of the capacitor decreases, the margin for error also decreases. This, in turn, degrades the accuracy of mismatch calculation.

Therefore, it would be advantageous to provide improved methods and integrated circuits for capacitor absolute value and mismatch measurement.

SUMMARY OF THE INVENTION

The present invention provides on-chip absolute value measurement circuit and an on-chip capacitor mismatch value measurement circuit. The absolute value measurement circuit begins charging a capacitor. When the voltage across the capacitor reaches a first threshold, the absolute value measurement circuit starts a counter. When the voltage across the capacitor reaches a second threshold, the counter stops. The counter value is provided as digital output. A computer device reads the digital output and calculates the absolute value of the capacitor based on the counter value.

The mismatch measurement circuit repeatedly charges an evaluation capacitor and transfers the charge from the evaluation capacitor to an integrating capacitor. For each transfer of charge, a counter is incremented until the voltage across the integrating capacitor reaches a threshold voltage. The counter value is provided as digital output. This process is repeated for each evaluation capacitor on the chip. A computer device reads each counter value and calculates mismatch values based on the counter values.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a block diagram illustrating a capacitor absolute value test setup in accordance with a preferred embodiment of the present invention;

FIG. 2 is a diagram depicting a capacitor absolute value measurement circuit in accordance with a preferred embodiment of the present invention;

FIG. 3 shows an example timing diagram for capacitor absolute value measurement in accordance with a preferred embodiment of the present invention;

FIG. 4 is a flowchart illustrating the operation of a capacitor absolute value measurement process in accordance with a preferred embodiment of the present invention;

FIG. 5 is a block diagram illustrating a capacitor mismatch test setup in accordance with a preferred embodiment of the present invention;

FIG. 6 is a diagram depicting a capacitor mismatch value measurement circuit in accordance with a preferred embodiment of the present invention;

FIG. 7 depicts timing diagram for the operation of determining a relative value for one evaluation capacitor in accordance with a preferred embodiment of the present invention; and FIG. 8 is a flowchart illustrating the operation of a capacitor mismatch value measurement process in accordance with a preferred embodiment of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular wiht referece to FIG. 1, a block diagram illustrating a capacitor absolute value test setup is shown in accordance with a preferred embodiment of the present invention. Capacitor circuit chip 100 is connected to workstation 102. The workstation may be a computer device, such as a desktop computer, a notebook computer, or a handheld computer. The workstation may also be specialized measurement computer device.

The workstation provides a start signal, START, to begin the test. The workstation then reads a digital value, DATA, provided by the capacitor measurement circuit within capacitor circuit 100. The DATA value may be used to determine the absolute value of a capacitor within the capacitor circuit. The workstation may also provide a clock signal, CK, to be used by the measurement circuit.

With reference to FIG. 2, a diagram depicting a capacitor absolute value measurement circuit is shown in accordance with a preferred embodiment of the present invention. The capacitor absolute value measurement circuit includes a capacitor to be measured, C1. All switches in the measurement circuit are assumed to be positively triggered, meaning that a high control signal closes the switch and a low signal opens the switch. However, other conventions may be used within the scope of the present invention.

Before measurement begins, START is low and the circuit is initialized by closing switch SW0 and SW1 while SW2 is open. Current Ibias, generated by current source 204, flows through switch SW1 to ground, all the charge is cleared from capacitor C1, and the voltage at node $V_A$ goes to zero. Techniques and circuits for generating a substantially constant current are known in the art.

To begin the measurement, START is asserted (high). Control circuit 202 assures that Q goes high before Qb goes low. This ensures that Ibias always has a place to flow and the current source is never turned off. This technique is commonly referred to as make-before-break switching. Now, in the charging phase of operation, SW0 and SW1 are now open, while SW2 is closed. Current Ibias now flows directly into capacitor C1, causing the voltage at node $V_A$ to rise linearly with time according to the following equation:

$$V = \int_{t1}^{t2} \frac{I}{C \cdot i \cdot \partial t}.$$

As $V_A$ becomes larger than $V_{REFM}$, V1 goes from low to high. $V_{REFM}$ is a predetermined, known, threshold voltage. The digital counter begins counting when comparator 208 is triggered by V1 going high. The N-bit digital counter counts up from zero in binary when there is a clock, CK, present and when V1 is high and V2 is low. The clock, CK, may be generated on-chip or supplied by a workstation or computer device.

Once the voltage $V_A$ becomes greater than that of $V_{REFP}$, then comparator 206 is triggered and V2 becomes high. $V_{REFP}$ is a predetermined, known, threshold voltage. The counter stops counting when V2 is high and the value of the counter is stored and ready for observation at the bus DATA, which is observable at external chip pins. At this point, the binary number stored in the counter represents the number of clock cycles that it took for capacitor C1 to charge from $V_{REFM}$ to $V_{REFP}$ using a constant current Ibias.

Given the values of $V_{REFM}$, $V_{REFP}$, Ibias, and the input clock frequency, the absolute value of the capacitor may be determined using the equation:

$$C_T = \frac{Ibias \cdot L \cdot T}{V_{REFP} - V_{REFM}}$$

where L is the number of clock cycles as recorded by the binary counter, T is the period of the clock input to node CK, and $C_T$ is the total capacitance at node $V_A$.

$C_T$, as measured above, includes C1 and all parasitic capacitances, $C_P$, at node $V_A$ ($C_T=C1+C_P$). To subtract $C_P$ from $C_T$, one must simply remove C1 from the circuit and repeat the above procedures to determine $C_P$. Now, given a value for $C_P$, one may determine the value of C1 as $C_T-C_P$.

With regard to current source 204, one method for obtaining a known bias current, Ibias, on chip is applying a voltage, perhaps $V_{BG}$, a band-gap voltage, across an external resistor, $R_{EXT}$ using a feedback loop. The current through this external resistor can be current mirrored to create Ibias. Since $V_{BG}$ and $R_{EXT}$ are external to the chip, both the resistor value and the voltage at $V_{BG}$ can be measured very accurately. Ibias will then simply be as follows:

$$Ibias = \frac{M \cdot V_{BG}}{R_{EXT}}$$

where M is any integer or real number representing the ratio of multiplication factors or widths in the current mirror devices. As to the voltages $V_{REFM}$ and $V_{REFP}$, there is also a need to know these voltage values to a reasonable degree of accuracy. A non-inverting op-amp configuration can create both of these voltages by multiplying or dividing the known $V_{BG}$ voltage.

FIG. 3 shows an example timing diagram for capacitor absolute value measurement in accordance with a preferred embodiment of the present invention. The number of clock cycles in a real conversion would be substantially larger than in this example to increase measurement resolution. $V_{REFP}$ and $V_{REFM}$ are chosen by the designer and are generally constrained to be within the power supply voltage available. For example $V_{REFM}$ is shown in FIG. 3 to be zero; however, $V_{REFM}$ could be any value between $V_{REFP}$ and ground.

With reference now to FIG. 4, a flowchart illustrating the operation of a capacitor absolute value measurement process is shown in accordance with a preferred embodiment of the present invention. The process begins by asserting the START signal (step 402) and starting a clock, CK (step 404). A control circuit causes Q to go high, closing switch SW2 (step 406). Subsequently, the control circuit causes Qb to go low, closing switches SW0 and SW1 (step 408). Next, a determination is made as to whether a first threshold voltage across the capacitor is reached (step 410). A first comparator causes V1 to go high when the first threshold is reached.

The capacitor continues to charge until the first threshold is reached and V1 goes high, at which time the counter starts (step 412). Next, a determination is made as to whether a second threshold voltage across the capacitor is reached (step 414). A second comparator causes V2 to go high when the second threshold is reached. The capacitor continues to charge until the second threshold is reached and V2 goes high, at which time the counter stops (step 416). The capacitor value is read at the DATA bus (step 418) and the process calculates the absolute capacitor value using the value at DATA (step 420). Thereafter, the process ends.

With reference now to FIG. 5, a block diagram illustrating a capacitor mismatch test setup is shown in accordance with a preferred embodiment of the present invention. Capacitor circuit chip 500 is connected to workstation 502. The workstation may be a computer device, such as a desktop computer, a notebook computer, or a handheld computer. The workstation may also be specialized measurement computer device.

The workstation provides a reset signal, RST, to begin each portion of the mismatch test. In the example shown in FIG. 5, the capacitor circuit includes four evaluation capacitors. The workstation may isolate each capacitor by asserting the appropriate combinations of P1A, P2A, P1B, P2B, P1C, P2C, P1D, P2D, P2, and P1R, as will be discussed below. The workstation then reads a digital value, DATA, provided by the capacitor measurement circuit within capacitor circuit 500 for each evaluation capacitor. The DATA values may be used to determine the capacitor mismatch values for the capacitors within the capacitor circuit.

With reference to FIG. 6, a diagram depicting a capacitor mismatch value measurement circuit is shown in accordance with a preferred embodiment of the present invention. Mismatch is generally defined as the difference in absolute capacitance for capacitors that are drawn equally on a chip, but differ in absolute value due to processing variations. This processing variation is generally caused by differences in dielectric thickness, in etchings of the capacitor plates, and in proximity effects. The present invention allows an accurate measurement to be obtained of on-chip capacitor matching in a packaged part with a digital tester.

The capacitor mismatch value measurement circuit includes evaluation capacitors to be measure, $C_A$, $C_B$, $C_C$, and $C_D$. While the example shown in FIG. 6 includes four evaluation capacitors, more or fewer capacitors may be measured within the scope of the present invention. Ideally these capacitors have the same value; however, non-ideal aspects during fabrication prevent these capacitors from having exactly the same absolute value. Feedback capacitor, $C_{FB}$, is a large integrating capacitor. As an example, $C_{FB}$ may be approximately 10,000 times larger than $C_A$ for this illustration. Amplifier 602 is used to create a switched capacitor integrator that transfers charge from the evaluation capacitors to the integrating capacitor. Comparator 604 compares the voltage at the output of the integrator, $V_O$, with an on-chip reference voltage, $V_{REF}$. Generally, $V_{REF}$ may be midway between the power supplies of the chip $(V_{DD}+V_{SS})/2$. The absolute value of $V_{REF}$ is not critical; however, $V_{REF}$ must remain consistent throughout the entire measurement.

The function of digital counter 606 is to count the number of clock cycles between reset, RST, and when the output of the comparator, $V_C$, toggles from a low to a high for each of the evaluation capacitors. In other words, the measurement circuit is reset and charge is repeatedly built up on evaluation capacitor $C_A$ and then transferred to $C_{FB}$ until the voltage across $C_{FB}$ equals $V_{REF}$. The DATA value is recorded for $C_A$ and the process repeats for $C_B$, and so on. The DATA value for $C_A$ may then be compared to the DATA value for $C_B$ to determine a mismatch between $C_A$ and $C_B$ for example.

Switches SW1, SW2, SW3, . . . , SW13 have two states, open and closed. All switches in the measurement circuit are assumed to be positively triggered, meaning that a high control signal closes the switch and a low signal opens the switch. However, other conventions may be used within the scope of the present invention.

The basic reset operation of FIG. 6 is as follows with RST asserted high. All P2* signals (P2* including P2, P2A, P2B, P2C, and P2D) are low, all P1* signals (P1* including P1, P1R, P1A, P1B, P1C, and P1D) are high, both RST switches (SW11 and SW12) are closed, and the digital counter is reset to zero. Each evaluation capacitor has $V_{REF}$ volts across them, since one side is permanently tied to $V_{REF}$ and the other side is grounded through a corresponding P1* switch. The integrating capacitor also has $V_{REF}$ volts across its terminals, since $V_M$ is shorted to $V_{REF}$ via SW11 and $V_O$ is tied to ground via SW12. In addition, $V_C$ is low since SW13 has the positive input of the comparator tied to ground with the negative input tied to $V_{REF}$.

Next, FIG. 7 depicts timing diagram illustrating the operation of determining a relative value for one evaluation capacitor in accordance with a preferred embodiment of the present invention. The circuit is reset as described above. Then, both the P1* and the RST signals go low followed by the signals P2A and P2 both going high. Hence, SW1 closes and the digital counter is incremented by one from the starting value of zero. With SW1 closed, the amplifier responds to the charge stored in $C_A$ by raising its output from ground to $V_{REF} \cdot (C_A/C_{FB})+0$, which is approximately $V_{REF} \cdot 1/10,000$.

Next, both P2 and P2A go low followed by P1A and P1R going high. With both P1A and P1R high, $C_A$ is recharged to $V_{REF}$ and the positive input of the comparator is raised to $V_{REF} \cdot (C_A/C_{FB})$ from ground. Since the positive input of the comparator is still lower than the negative input of the comparator ($V_{REF}$), $V_C$ remains low.

Thereafter, both P1A and P1R go low followed by P2A and P2 again both going high. Again, SW1 closes and the digital counter is incremented by one to a value of two. With SW1 closed, the amplifier again responds to the charge stored in $C_A$ by raising its output from $V_{REF} \cdot (C_A/C_{FB})$ to $V_{REF} \cdot (2C_A/C_{FB})$. Again, both P2 and P2A go low followed by P1A and P1R going high. With both P1A and P1R high, $C_A$ is again recharged to $V_{REF}$ and the positive input of the comparator rises to its new value of $V_{REF} \cdot (2C_A/C_{FB})$. However, the positive comparator input is still lower than $V_{REF}$ and $V_C$ remains low.

This cycle of charging $C_A$ to $V_{REF}$, transferring the charge from $C_A$ to $C_{FB}$, and incrementing the counter continues until the voltage at $V_O$ is greater than $V_{REF}$. When $V_O$ is greater than $V_{REF}$, the comparator triggers and $V_C$ goes high, at which time the relative value of $C_A$ is inferred from the value of the digital counter. Since $C_A$ is assumed to be $1/10,000$ of $C_{FB}$, the counter should have a value of 10,001 stored, with the extra value resulting from the comparator triggering when $V_O$ is greater than $V_{REF}$ rather than exactly equal.

Next, the relative value of $C_B$ is determined exactly as $C_A$ was determined. The circuit starts with a basic reset as previously described and the controls of P1A and P2A for SW2 and SW1 are substituted with controls for P1B and P2B for SW4 and SW3. For illustration purposes, assume that $C_B$ and $C_A$ are not perfectly matched such that $C_B = 1.1 \cdot C_A$. Since $C_{FB}$ is unchanged, it will take fewer charge transfer cycles for $C_B$ to make the comparator trigger than it did for $C_A$. More specifically, the counter will trigger at a value of $10,000/1.1 = 9,091$. Hence, the mismatch for $C_A$ and $C_B$ can be calculated as $10,000/9,091 = 1.1$, which clearly infers a 10% mismatch between $C_A$ and $C_B$.

The evaluation capacitors $C_C$ and $C_D$ may be evaluated and their relative values determined to infer mismatch between $C_A$, $C_B$, $C_C$, and $C_D$. The four capacitors are used as an illustrative example. In practice, the number of capacitors would be much larger to get a more representative distribution of capacitor mismatch. Additionally, the relative value of the feedback capacitor can be made much larger to increase the measurement resolution or smaller for faster measurements and to consume less silicon area in fabrication.

Turning now to FIG. 8, a flowchart illustrating the operation of a capacitor mismatch value measurement process is shown in accordance with a preferred embodiment of the present invention. The process begins and initializes the circuit (step 802). Then, the process charges the evaluation capacitor (step 804), transfers the charge from the evaluation capacitor to the integrating capacitor (step 806), and increments a counter (step 808). Next, a determination is made as to whether a threshold voltage is reached (step 810). If the threshold voltage is not reached, the process returns to step 804 to repeat the charge and transfer steps.

If the threshold voltage is reached in step 810, the process reads the relative data value (step 812) and a determination is made as to whether this is the last evaluation capacitor (step 814). If the current capacitor is not the last evaluation capacitor, the process considers the next evaluation capacitor (step 816) and returns to step 802 to initialize the measurement circuit. If, however, the current capacitor is the last evaluation capacitor in step 814, the process calculates mismatch values (step 818) and ends.

Thus, the present invention provides a digital tester for retrieving digital capacitor values and relative mismatch values. The test structures may be in either packaged or wafer form. The measurements of the present invention do not require an expensive and specialized capacitor/voltage measurement test box. Each capacitor measurement takes milliseconds, where each measurement using a capacitor/voltage measurement test box takes seconds, since probes must be lifted and placed on each capacitor site. Circuits sensitive to capacitor mismatch or accurate absolute value may use this circuit in a production test to quickly verify capacitor values and receive results in a digital form. The absolute value and mismatch value test circuits may also be employed separately or together in the same integrated circuit.

What is claimed is:

1. A method for on-chip measurement of capacitor values, the method comprising:

receiving, from an off-chip device, a set of digital inputs, wherein the set of digital inputs includes a reset signal and a plurality of switch signals;

measuring a value for an evaluation capacitor on the chip, wherein the step of measuring a value includes:

(a) charging the evaluation capacitor;

(b) transferring charge from the evaluation capacitor to an integrating capacitor;

(c) incrementing a counter; and (d) repeating steps (a)–(c) until a threshold voltage is reached at the integrating capacitor; and providing the counter value to the off-chip device in response to the threshold voltage being reached at the integrating capacitor.

2. The method of claim 1, further comprising:

determining, by the off-chip device, a capacitor mismatch value for the evaluation capacitor based on the counter value.

3. The method of claim 2, wherein the evaluation capacitor is a first evaluation capacitor and the capacitor mismatch value is a first capacitor mismatch value, the method further comprising:

determining, by the off-chip device, a second capacitor mismatch value for the second evaluation capacitor based on the second counter value; and determining a mismatch between the first evaluation capacitor and the second evaluation capacitor based on the first capacitor mismatch value and the second capacitor mismatch value.

4. The method of claim 2, wherein the evaluation capacitor is a first evaluation capacitor and the capacitor mismatch value is a first capacitor mismatch value, the method farther comprising:

receiving a reset signal and a set of switch signals for switching to a second evaluation capacitor;

draining the integrating capacitor;

resetting the counter;

(e) charging the second evaluation capacitor, (f) transferring charge from the second evaluation capacitor to an integrating capacitor;

(g) incrementing the counter;

(h) repeating steps (e)–(g) until the threshold voltage is reached at the integrating capacitor; and providing a second counter value to the off-chip device.

5. The method of claim 4, further comprising:

determining, by the off-chip device, a second capacitor mismatch value for the second evaluation capacitor based on the second counter value; and determining a mismatch between the first evaluation capacitor and the second evaluation capacitor based on the first capacitor mismatch value and the second capacitor mismatch value.

6. An apparatus for on-chip measurement of capacitor values, the apparatus comprising:

a set of digital inputs, wherein the set of digital inputs receive signals from an off-chip device and wherein the set of digital inputs includes a reset signal and a plurality of switch signals;

an evaluation capacitor on the chip;

a test circuit, wherein the test circuit measures a value for the evaluation capacitor based on the set of digital inputs, wherein the test circuit includes:

an integrating capacitor;

a first set of switches, wherein the evaluation capacitor is charged in response to the first set of switches being closed;

a second set of switches, wherein charge from the evaluation capacitor is transferred to an integrating capacitor in response to the second set of switches being closed; and a counter, wherein the test circuit repeatedly closes the first set of switches to charge the evaluation capacitor, closes the second set of switches to transfer charge from the evaluation capacitor to the integrating capacitor, and increments the counter until a threshold voltage is reached at the integrating capacitor and wherein the test circuit provides the counter value to the off-chip device in response to the threshold voltage being reached at the integrating capacitor; and a digital output, wherein the digital output presents the counter value.

7. The apparatus of claim 6, wherein the off-chip device determines a capacitor mismatch value for the evaluation capacitor based on the counter value.

8. The apparatus of claim 7, wherein the evaluation capacitor is a first evaluation capacitor and the capacitor mismatch value is a first capacitor mismatch value, and wherein the off-chip device determines a second capacitor mismatch value for the second evaluation capacitor based on the second counter value and determines a mismatch between the first evaluation capacitor and the second evaluation capacitor based on the first capacitor mismatch value and the second capacitor mismatch value.

9. The apparatus of claim 7, wherein the evaluation capacitor is a first evaluation capacitor and the capacitor mismatch value is a first capacitor mismatch value, the apparatus further comprising:

a second evaluation capacitor;

a third set of switches, wherein the second evaluation capacitor is charged in response to the third set of switches being closed; and a fourth set of switches, wherein charge from the second evaluation capacitor is transferred to an integrating capacitor in response to the fourth set of switches being closed, wherein the test circuit receives a reset signal and a set of switch signals for switching to a second evaluation capacitor, drains the integrating capacitor, resets the counter, wherein the test circuit repeatedly closes the third set of switches to charge the second evaluation capacitor, closes the fourth set of switches to transfer charge from the second evaluation capacitor to the integrating capacitor, and increments the counter until a threshold voltage is reached at the integrating capacitor, and wherein the test circuit provides the counter value to the off-chip device in response to the threshold voltage being reached at the integrating capacitor.

10. The apparatus of claim 9, wherein the off-chip device determines a second capacitor mismatch value for the second evaluation capacitor based on the second counter value, and wherein the off-chip device determines a mismatch between the first evaluation capacitor and the second evaluation capacitor based on the first capacitor mismatch value and the second capacitor mismatch value.

* * * * *